United States Patent
Kweon et al.

(10) Patent No.: US 6,815,002 B2
(45) Date of Patent: Nov. 9, 2004

(54) METHOD FOR DISPENSING LIQUID CRYSTAL USING PLURALITY OF LIQUID CRYSTAL DISPENSING DEVICES

(75) Inventors: Hyug-Jin Kweon, Kyoungsangbuk-Do (KR); Hae-Joon Son, Pusan (KR)

(73) Assignee: LG. Philips LCD Co., Ltd., Seoul (KR)

( * ) Notice: Subject to any disclaimer, the term of this patent is extended or adjusted under 35 U.S.C. 154(b) by 203 days.

(21) Appl. No.: 10/184,084

(22) Filed: Jun. 28, 2002

(65) Prior Publication Data

US 2003/0180978 A1 Sep. 25, 2003

(30) Foreign Application Priority Data

Mar. 25, 2002 (KR) ........................................ 2002-15967

(51) Int. Cl.$^7$ .............................. B05D 5/12; H01J 9/20
(52) U.S. Cl. ..................... 427/58; 427/162; 427/168; 445/9; 445/24
(58) Field of Search ..................... 427/58, 162, 164, 427/168; 118/313, 315; 445/24, 25, 9

(56) References Cited

U.S. PATENT DOCUMENTS

| | | |
|---|---|---|
| 3,978,580 A | 9/1976 | Leupp et al. |
| 4,094,058 A | 6/1978 | Yasutake et al. |
| 4,653,864 A | 3/1987 | Baron et al. |
| 4,691,995 A | 9/1987 | Yamazaki et al. |
| 4,775,225 A | 10/1988 | Tsuboyama et al. |
| 5,247,377 A | 9/1993 | Omeis et al. |
| 5,263,888 A | 11/1993 | Ishihara et al. |
| 5,379,139 A | 1/1995 | Sato et al. |
| 5,406,989 A | 4/1995 | Abe |
| 5,499,128 A | 3/1996 | Hasegawa et al. |
| 5,507,323 A | 4/1996 | Abe |
| 5,511,591 A | 4/1996 | Abe |
| 5,539,545 A | 7/1996 | Shimizu et al. |
| 5,548,429 A | 8/1996 | Tsujita |
| 5,642,214 A | 6/1997 | Ishii et al. |
| 5,680,189 A | 10/1997 | Shimizu et al. |
| 5,742,370 A | 4/1998 | Kim et al. |
| 5,757,451 A | 5/1998 | Miyazaki et al. |
| 5,852,484 A | 12/1998 | Inoue et al. |
| 5,854,664 A | 12/1998 | Inoue et al. |
| 5,861,932 A | 1/1999 | Inata et al. |
| 5,875,922 A | 3/1999 | Chastine et al. |
| 5,952,678 A | 9/1999 | Ashida |
| 5,956,112 A | 9/1999 | Fujimori et al. |
| 6,001,203 A | 12/1999 | Yamada et al. |
| 6,011,609 A | 1/2000 | Kato et al. |
| 6,016,178 A | 1/2000 | Kataoka et al. |
| 6,016,181 A | 1/2000 | Shimada |
| 6,055,035 A | 4/2000 | von Gutfeld et al. |
| 6,163,357 A | 12/2000 | Nakamura |
| 6,219,126 B1 | 4/2001 | von Gutfeld |
| 6,226,067 B1 | 5/2001 | Nishiguchi et al. |
| 6,236,445 B1 | 5/2001 | Foschaar et al. |
| 6,304,306 B1 | 10/2001 | Shiomi et al. |
| 6,304,311 B1 | 10/2001 | Egami et al. |
| 6,337,730 B1 | 1/2002 | Ozaki et al. |
| 6,414,733 B1 | 7/2002 | Ishikawa et al. |
| 2001/0021000 A1 | 9/2001 | Egami |

FOREIGN PATENT DOCUMENTS

| | | |
|---|---|---|
| EP | 1003066 A1 | 5/2000 |
| JP | 51-065656 | 6/1976 |
| JP | 57038414 | 3/1982 |
| JP | 57088428 | 6/1982 |
| JP | 58027126 | 2/1983 |
| JP | 59-057221 | 4/1984 |
| JP | 59-195222 | 11/1984 |

(List continued on next page.)

*Primary Examiner*—Brian K. Talbot
(74) *Attorney, Agent, or Firm*—McKenna Long & Aldridge LLP (57) ABSTRACT

A method of dispensing liquid crystal from N liquid crystal dispensing devices onto M panel locations (M>N) such that the amount of liquid crystal dispensed from each of the N liquid crystal dispensing devices is substantially the same.

13 Claims, 9 Drawing Sheets

FOREIGN PATENT DOCUMENTS

| | | |
|---|---|---|
| JP | 60-111221 | 6/1985 |
| JP | 60164723 | 8/1985 |
| JP | 60217343 | 10/1985 |
| JP | 61007822 | 1/1986 |
| JP | 61055625 | 3/1986 |
| JP | 62089025 | 4/1987 |
| JP | 62090622 | 4/1987 |
| JP | 62205319 | 9/1987 |
| JP | 63109413 | 5/1988 |
| JP | 63110425 | 5/1988 |
| JP | 63128315 | 5/1988 |
| JP | 63311233 | 12/1988 |
| JP | 127179 * | 5/1993 |
| JP | 05127179 | 5/1993 |
| JP | 05-154923 | 6/1993 |
| JP | 5154923 | 6/1993 |
| JP | 281557 * | 10/1993 |
| JP | 05265011 | 10/1993 |
| JP | 05281557 | 10/1993 |
| JP | 05281562 | 10/1993 |
| JP | 051256 * | 2/1994 |
| JP | 06051256 | 2/1994 |
| JP | 148657 * | 5/1994 |
| JP | 06148657 | 5/1994 |
| JP | 6160871 | 6/1994 |
| JP | 06-235925 | 8/1994 |
| JP | 6235925 | 8/1994 |
| JP | 06265915 | 9/1994 |
| JP | 6313870 | 11/1994 |
| JP | 06-313870 | 11/1994 |
| JP | 07-084268 | 3/1995 |
| JP | 7084268 | 3/1995 |
| JP | 128674 * | 5/1995 |
| JP | 07128674 | 5/1995 |
| JP | 07181507 | 7/1995 |
| JP | 08095066 | 4/1996 |
| JP | 08-101395 | 4/1996 |
| JP | 8101395 | 4/1996 |
| JP | 08106101 | 4/1996 |
| JP | 08171094 | 7/1996 |
| JP | 08190099 | 7/1996 |
| JP | 08240807 | 9/1996 |
| JP | 09005762 | 1/1997 |
| JP | 09026578 | 1/1997 |
| JP | 09-061829 | 3/1997 |
| JP | 9061829 | 3/1997 |
| JP | 09073075 | 3/1997 |
| JP | 09073096 | 3/1997 |
| JP | 09127528 | 5/1997 |
| JP | 09230357 | 9/1997 |
| JP | 09281511 | 10/1997 |
| JP | 09311340 | 12/1997 |
| JP | 10123537 | 5/1998 |
| JP | 10123538 | 5/1998 |
| JP | 10142616 | 5/1998 |
| JP | 10177178 | 6/1998 |
| JP | 10-177178 | 6/1998 |
| JP | 10221700 | 8/1998 |
| JP | 10282512 | 10/1998 |
| JP | 10333157 | 12/1998 |
| JP | 10-333157 | 12/1998 |
| JP | 10333159 | 12/1998 |
| JP | 10-333159 | 12/1998 |
| JP | 11014953 | 1/1999 |
| JP | 11038424 | 2/1999 |
| JP | 11064811 | 3/1999 |
| JP | 11109388 | 4/1999 |
| JP | 11133438 | 5/1999 |
| JP | 11-133438 | 5/1999 |
| JP | 11-142864 | 5/1999 |
| JP | 11142864 | 5/1999 |
| JP | 11174477 | 7/1999 |
| JP | 11212045 | 8/1999 |
| JP | 11248930 | 9/1999 |
| JP | 11-248930 | 9/1999 |
| JP | 11-326922 | 11/1999 |
| JP | 11326922 | 11/1999 |
| JP | 11344714 | 12/1999 |
| JP | 2000-002879 | 1/2000 |
| JP | 2000029035 | 1/2000 |
| JP | 2000-056311 | 2/2000 |
| JP | 2000-066165 | 3/2000 |
| JP | 2000-066165 | 3/2000 |
| JP | 2000-137235 | 5/2000 |
| JP | 3000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 | 2/2001 |
| JP | 2001-042341 | 2/2001 |
| JP | 2001-051284 | 2/2001 |
| JP | 2001-066615 | 3/2001 |
| JP | 2001-091727 | 4/2001 |
| JP | 2001117105 | 4/2001 |
| JP | 2001-117109 | 4/2001 |
| JP | 2001-133745 | 5/2001 |
| JP | 2001133794 | 5/2001 |
| JP | 2001-133799 | 5/2001 |
| JP | 2001142074 | 5/2001 |
| JP | 2001147437 | 5/2001 |
| JP | 2001154211 | 6/2001 |
| JP | 2001-166272 | 6/2001 |
| JP | 2001-166310 | 6/2001 |
| JP | 2001-183683 | 7/2001 |
| JP | 2001-209052 | 8/2001 |
| JP | 2001-209060 | 8/2001 |
| JP | 2001-222017 | 8/2001 |
| JP | 2001-235758 | 8/2001 |
| JP | 2001-215459 | 9/2001 |
| JP | 2001255542 | 9/2001 |
| JP | 2001264782 | 9/2001 |
| JP | 2001-201750 | 10/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |
| JP | 2001-330837 | 11/2001 |
| JP | 2001330840 | 11/2001 |
| JP | 2001-356353 | 12/2001 |
| JP | 2001356354 | 12/2001 |
| JP | 2002014360 | 1/2002 |
| JP | 2002023176 | 1/2002 |
| JP | 2002049045 | 2/2002 |
| JP | 2002082340 | 3/2002 |
| JP | 2002090759 | 3/2002 |
| JP | 2002090760 | 3/2002 |
| JP | 2002107740 | 4/2002 |
| JP | 2002122872 | 4/2002 |
| JP | 2002122873 | 4/2002 |
| JP | 2002080321 | 6/2002 |
| JP | 2002202512 | 7/2002 |
| JP | 2002202514 | 7/2002 |
| JP | 2002214626 | 7/2002 |
| KR | 2000-0035302 A1 | 6/2000 |

* cited by examiner

METHOD FOR DISPENSING LIQUID CRYSTAL USING PLURALITY OF LIQUID CRYSTAL DISPENSING DEVICES

This application incorporates by reference two co-pending applications, Ser. No. 10/184,096, filed on Jun. 28, 2002, entitled "SYSTEM AND METHOD FOR MANUFACTURING LIQUID CRYSTAL DISPLAY DEVICES" and Ser. No. 10/184,088, filed on Jun. 28, 2002, entitled "SYSTEM FOR FABRICATING LIQUID CRYSTAL DISPLAY AND METHOD OF FABRICATING LIQUID CRYSTAL DISPLAY USING THE SAME", as if fully set forth herein.

This application claims the benefit of Korean Patent Application No. P2002-15967, filed on Mar. 25, 2002, which is hereby incorporated by reference for all purposes as if fully set forth herein.

BACKGROUND OF THE INVENTION

1. Field of the Invention

The present invention relates to a method of dispensing liquid crystal. More particularly, the present invention relates to a method of dispensing liquid crystal from N liquid crystal dispensing devices onto M panel locations (where M>N) such that the amount of liquid crystal dispensed from each of the N liquid crystal dispensing devices over time is substantially the same.

2. Discussion of the Related Art

Portable electric devices, such as mobile phones, personal digital assistants (PDA), and notebook computers, often require thin, lightweight, and efficient flat panel displays. There are various types of flat panel displays, including liquid crystal displays (LCD), plasma display panels (PDP), field emission displays (FED), and vacuum fluorescent displays (VFD). Of these, LCDs have the advantages of being widely available, easy to use, and superior image quality.

Figure 1:
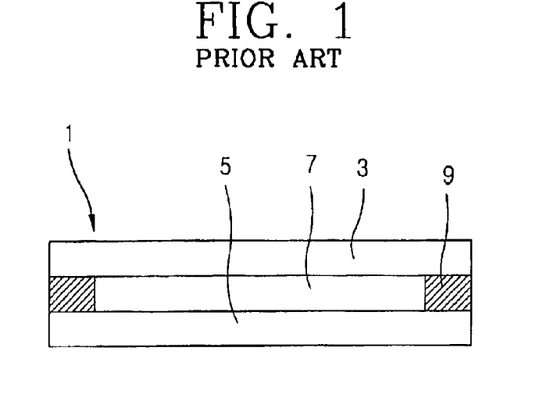
FIG. 1 is a cross-sectional view showing a general LCD.

The LCD displays information based on the refractive anisotropy of liquid crystal. As shown in FIG. 1, an LCD 1 comprises a lower substrate 5, an upper substrate 3, and a liquid crystal layer 7 that is disposed between the lower substrate 5 and the upper substrate 3. The lower substrate 5 includes an array of driving devices and a plurality of pixels (not shown). The individual driving devices are usually thin film transistors (TFT) located at each pixel. The upper substrate 3 includes color filters for producing color. Furthermore, a pixel electrode and a common electrode are respectively formed on the lower substrate 5 and on the upper substrate 3. Alignment layers are formed on the lower substrate 5 and on the upper substrate 3. The alignment layers are used to uniformly align the liquid crystal layer 7.

The lower substrate 5 and the upper substrate 3 are attached using a sealing material 9. In operation, the liquid crystal molecules are initially oriented by the alignment layers, and then reoriented by the driving device according to video information so as to control the light transmitted through the liquid crystal layer to produce an image.

The fabrication of an LCD device requires the forming of driving devices on the lower substrate 5, the forming of the color filters on the upper substrate 3, and performing a cell process (described subsequently). Those processes will be described with reference to FIG. 2.

Figure 2:
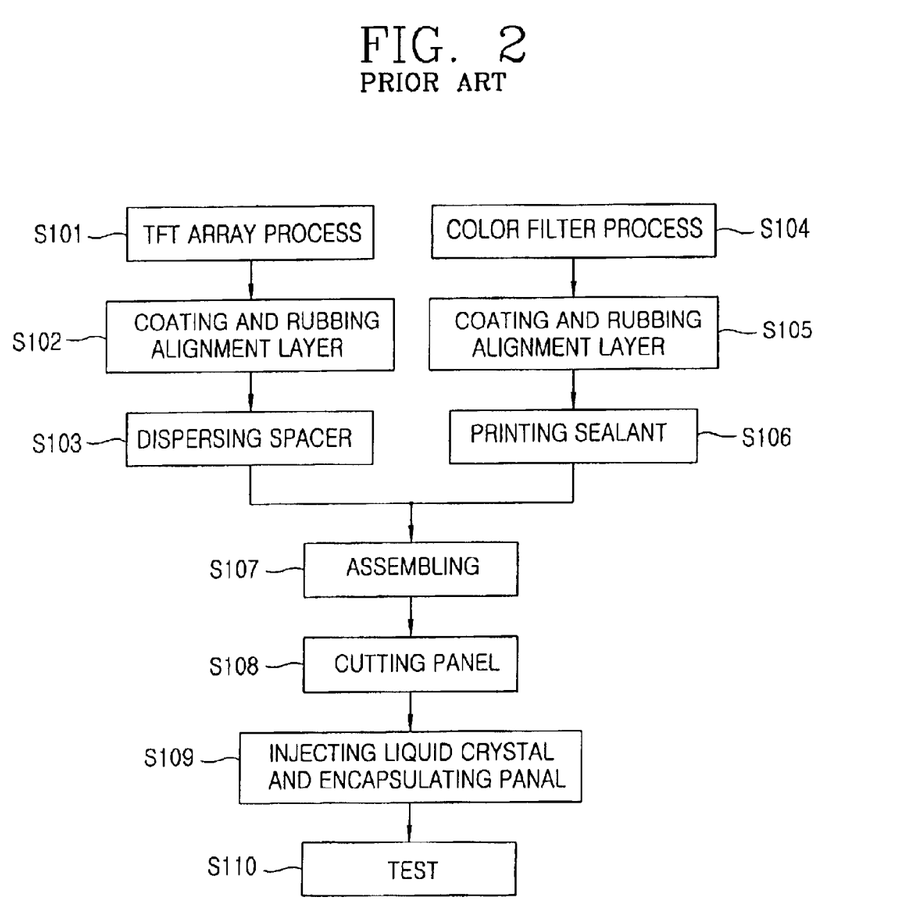
FIG. 2 is a flow chart showing a conventional method for fabricating the LCD.

Initially, in step S101, a plurality of perpendicularly crossing gate lines and data lines are formed on the lower substrate 5, thereby defining pixel areas between the gate and data lines. A thin film transistor that is connected to a gate line and to a data line is formed in each pixel area. Also, a pixel electrode that is connected to the thin film transistor is formed in each pixel area. This enables driving the liquid crystal layer according to signals applied through the thin film transistor.

In step S104, R (Red), G (Green), and B (Blue) color filter layers (for reproducing color) and a common electrode are formed on the upper substrate 3. Then, in steps S102 and S105, alignment layers are formed on the lower substrate 5 and on the upper substrate 3. The alignment layers are rubbed to induce surface anchoring (establishing a pretilt angle and an alignment direction) for the liquid crystal molecules. Thereafter, in step S103, spacers for maintaining a constant, uniform cell gap is dispersed onto the lower substrate 5.

Then, in steps S106 and S107, a sealing material is applied onto outer portions such that the resulting seal has a liquid crystal injection opening. That opening is used to inject liquid crystal. The upper substrate 3 and the lower substrate 5 are then attached together by compressing the sealing material.

While the foregoing has described forming a single panel area, in practice it is economically beneficial to form a plurality of unit panel areas. To this end, the lower substrate 5 and the upper substrate 3 are large glass substrates that contain a plurality of unit panel areas, each having a driving device array or a color filter array surrounded by sealant having a liquid crystal injection opening. To isolate the individual unit panels, in step S108 the assembled glass substrates are cut into individual unit panels. Thereafter, in step S109 liquid crystal is injected into the individual unit panels by way of liquid crystal injection openings, which are then sealed. Finally, in step S110 the individual unit panels are tested.

Figure 3:
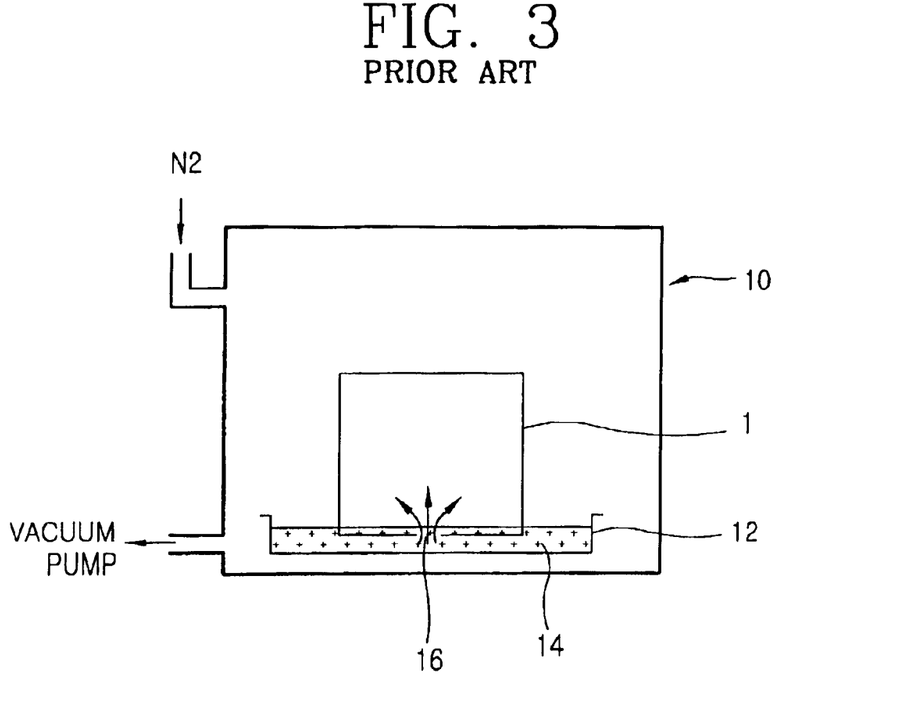
FIG. 3 is a view showing liquid crystal injection in the conventional method for fabricating the LCD.

As described above, liquid crystal is injected through a liquid crystal injection opening. Injection of the liquid crystal is usually pressure induced. FIG. 3 shows a device for injecting liquid crystal. As shown, a container 12 that contains liquid crystal, and a plurality of individual unit panels 1 are placed in a vacuum chamber 10 such that the individual unit panels 1 are located above the container 12. The vacuum chamber 10 is connected to a vacuum pump that produces a predetermined vacuum. A liquid crystal display panel moving device (not shown) moves the individual unit panels 1 into contact with the liquid crystal 14 such that each injection opening 16 is in the liquid crystal 14.

When the vacuum within the chamber 10 is increased by inflowing nitrogen gas ($N_2$) the liquid crystal 14 is injected into the individual unit panels 1 through the liquid crystal injection openings 16. After the liquid crystal 14 entirely fills the individual unit panels 1, the liquid crystal injection opening 16 of each individual unit panel 1 is sealed by a sealing material.

While generally successful, there are problems with pressure injecting liquid crystal 14. First, the time required for the liquid crystal 14 to inject into the individual unit panels 1 is rather long. Generally, the gap between the driving device array substrate and the color filter substrate is very narrow, on the order of micrometers. Thus, only a very small amount of liquid crystal 14 is injected into per unit time. For example, it takes about 8 hours to inject liquid crystal 14 into an individual 15-inch unit panel 1. This decreases fabrication efficiency.

Second, liquid crystal 14 consumption is excessive. Only a small amount of liquid crystal 14 in the container 12 is actually injected into the individual unit panels 1. Since liquid crystal 14 exposed to air or to certain other gases can be contaminated by chemical reaction the remaining liquid crystal 14 should be discarded. This increases liquid crystal fabrication costs.

Therefore, a method of disposing liquid crystal between substrates using a plurality of liquid crystal dispensing devices would be beneficial. Even more beneficial would be a method of using N liquid crystal dispensing devices to disposing liquid crystal on M substrate locations, wherein M>N, such that the amount of liquid crystal dispensed from each of the N liquid crystal dispensing devices over time is substantially the same.

SUMMARY OF THE INVENTION

Accordingly, the present invention is directed to provide a method for dispensing liquid crystal that enables increased efficiency and reduced liquid crystal consumption by applying liquid crystal from a plurality of liquid crystal dispensing devices onto a plurality of liquid crystal panels that substantially obviates one or more of the problems due to limitations and disadvantages of the related art.

Another advantage of the present invention is to provide a method of dispensing liquid crystal from N liquid crystal dispensing devices onto M panel areas, wherein M>N, such that each liquid crystal dispensing device applies substantially the same amount of liquid crystal over time. This beneficially reduces refilling, cleaning, and set-up problems associated with refilling liquid crystal into the liquid crystal containers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings To achieve these and other advantages and in accordance with the purpose of the present invention, as embodied and broadly described herein, there is provided a method for dispensing liquid crystal, wherein liquid crystal is applied onto a substrate on which a plurality of liquid crystal panel columns are disposed using a plurality of liquid crystal dispensing devices. The plurality of liquid crystal dispensing devices apply liquid crystal onto a plurality of liquid crystal panel columns, except onto a first column. A first liquid crystal dispensing device of the plurality of liquid crystal dispensing devices subsequently applies liquid crystal onto the first column. The plurality of liquid crystal dispensing devices then apply liquid crystal onto a plurality of liquid crystal panel columns of a second substrate, except onto a second column. Then, liquid crystal is applied onto the second column using a second liquid crystal dispensing device of the plurality of liquid crystal dispensing devices.

The principles of the present invention further provide for a method of applying liquid crystals from N liquid crystal dispensing devices onto a plurality of substrates, each substrate having a plurality of liquid crystal panels aligned in M columns, wherein M is greater than N. That method includes applying liquid crystals from the N liquid crystal dispensing devices onto the liquid crystal panels in N columns of a first substrate. Then, applying liquid crystals onto the liquid crystal panels of an N+1th column of the first substrate using a first liquid crystal dispensing device of the N liquid crystal dispensing devices. Then, applying liquid crystals from the N liquid crystal dispensing devices onto the liquid crystal panels in N columns of a second substrate. Finally, applying liquid crystals onto the liquid crystal panels of an N+1th column of the second substrate using a second liquid crystal dispensing device of the N liquid crystal dispensing devices.

The principles of the present invention further provide for applying liquid crystals from the N liquid crystal dispensing devices onto the liquid crystal panels in N columns of a third substrate, and then applying liquid crystals onto the liquid crystal panels of an N+1th column of the third substrate using a third liquid crystal dispensing device of the N liquid crystal dispensing devices. Furthermore, the principles of the present invention provide for applying liquid crystals from the N liquid crystal dispensing devices onto the liquid crystal panels in N columns of a fourth substrate, and then applying liquid crystals onto the liquid crystal panels of an N+1th column of the fourth substrate using a fourth liquid crystal dispensing device of the N liquid crystal dispensing devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

To solve the problems of the conventional liquid crystal injection methods, a novel liquid crystal dropping method has been recently introduced. The liquid crystal dropping method forms a liquid crystal layer by directly applying liquid crystal onto a substrate and then spreading the applied liquid crystal by pressing substrates together. According to the liquid crystal dropping method, the liquid crystal is applied to the substrate in a short time period such that the liquid crystal layer can be formed quickly. In addition, liquid crystal consumption can be reduced due to the direct application of the liquid crystal, thereby reducing fabrication costs.

Figure 4:
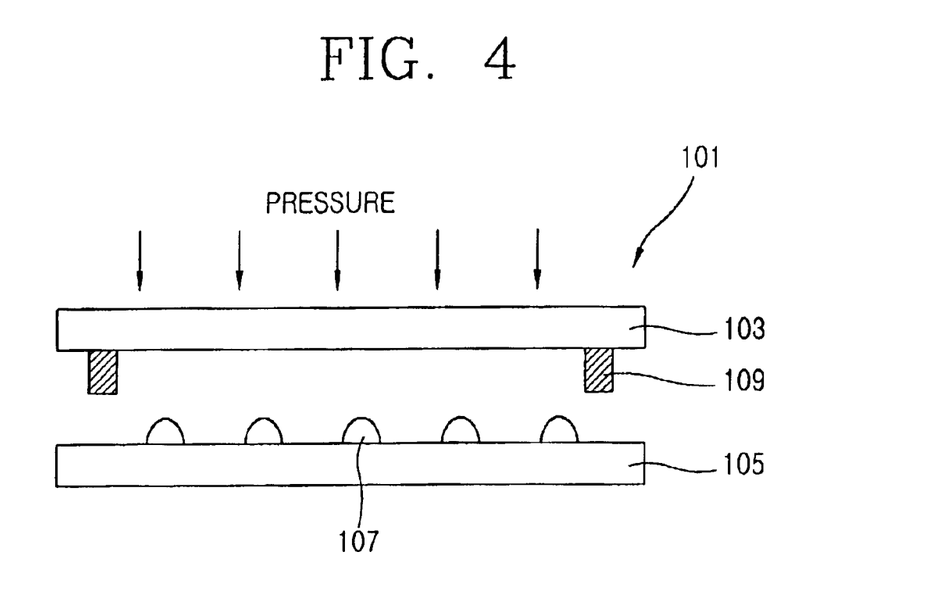
FIG. 4 is a view showing an exemplary LCD fabricated using a method for dropping liquid crystal according to the present invention.

FIG. 4 illustrates the basic liquid crystal dropping method. As shown, liquid crystal is dropped (applied) directly onto a lower substrate 105 before the lower substrate 105 and the upper substrate 103 are assembled. Alternatively, the liquid crystal 107 may be dropped onto the upper substrate 103. That is, the liquid crystal may be formed either on a TFT (thin film transistor) substrate or on a CF (color filter) substrate. However, the substrate on which the liquid crystal is applied should be the lower substrate during assembly.

A sealing material 109 is applied on an outer part of the upper substrate (substrate 103 in FIG. 4). The upper substrate (103) and the lower substrate (105) are then mated and pressed together. At this time the liquid crystal drops (107) spread out by the pressure, thereby forming a liquid crystal layer having uniform thickness between the upper substrate 103 and the lower substrate 105.

Figure 5:
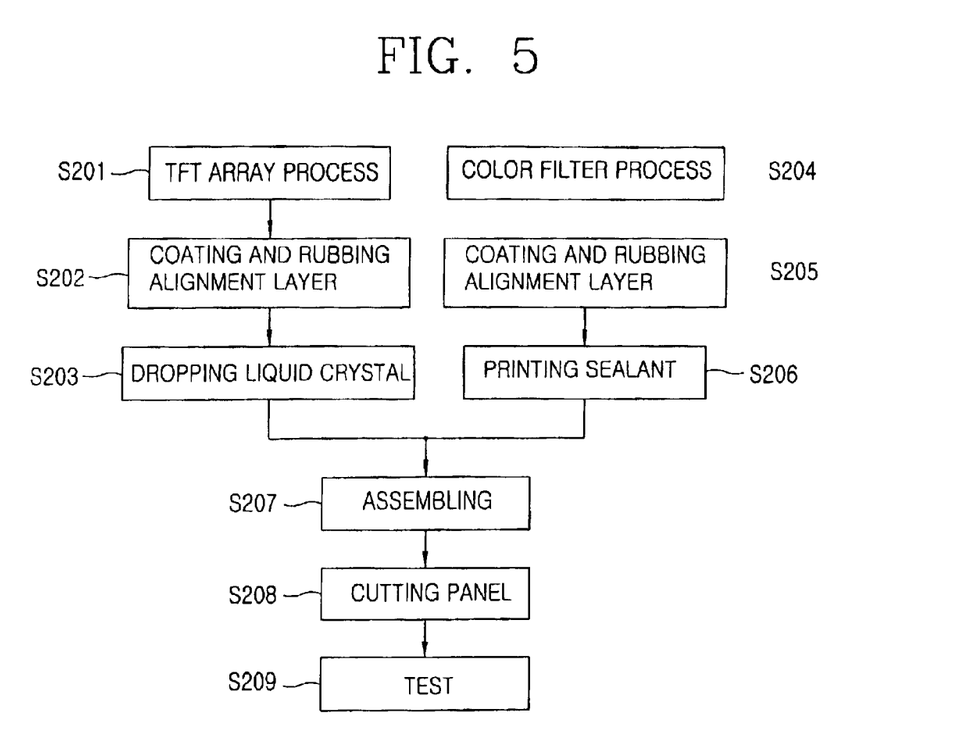
FIG. 5 is a flow chart showing an exemplary method for fabricating the LCD according to the liquid crystal dropping method.

FIG. 5 presents a flowchart of a method of fabricating LCDs using the liquid crystal dropping method. As shown, in steps S201 and S202 the TFT array is fabricated and processed, and an alignment layer is formed and rubbed. In steps S204 and S205 a color filter array is fabricated, and processed, and an alignment layer is formed and rubbed. Then, as shown in step S203 liquid crystal is dropped (applied) onto one of the substrates. In FIG. 5, the TFT array substrate is shown as receiving the drops, but the color filter substrate might be preferred in some applications. Additionally, as shown in step S206, a sealant is printed onto one of the substrates, in FIG. 5 the color filter substrate (the TFT array substrate might be preferred in some applications). It should be noted that the TFT array fabrication process and the color filter fabrication process are generally similar to those used in conventional LCD fabrication processes. By applying liquid crystals by dropping it directly onto a substrate it is possible to fabricate LCDs using large-area glass substrates (1000×1200 mm$^2$ or more), which is much larger than feasible using conventional fabrication methods.

Thereafter, the upper and lower substrates are disposed facing each other and pressed to attach to each other using the sealing material. This compression causes the dropped liquid crystal to evenly spread out on entire panel. This is performed in step S207. By this process, a plurality of unit liquid crystal panel areas having liquid crystal layers are formed by the assembled glass substrates. Then, in step S208 the glass substrates are processed and cut into a plurality of liquid crystal display unit panels. The resultant individual liquid crystal panels are then inspected, thereby finishing the LCD panel process, reference step S209.

The liquid crystal dropping method is much faster than conventional liquid crystal injection methods. Moreover, the liquid crystal dropping method avoids liquid crystal contamination. Finally, the liquid crystal dropping method, once perfected, is simpler than the liquid crystal injection method, thereby enabling improved fabrication efficiency and yield.

Figure 6:
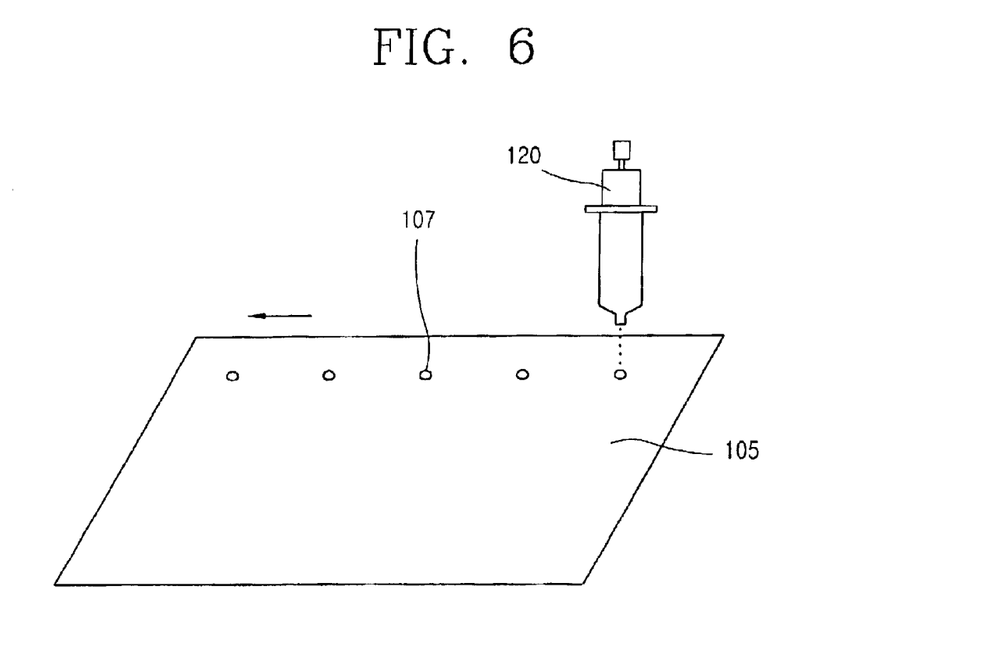
FIG. 6 is a view showing the basic concept of the liquid crystal dropping method.

In the liquid crystal dropping method, to form a liquid crystal layer having a desired thickness, the dropping position of the liquid crystal and the dropping amount of the liquid crystal should be carefully controlled. FIG. 6 illustrates dropping liquid crystal 107 onto the substrate 105 (beneficially a large glass substrate) using a liquid crystal dispensing device 120. As shown, the liquid crystal dispensing device 120 is installed above the substrate 105.

Generally, liquid crystal 107 is dropped onto the substrate 105 as well-defined drops. The substrate 105 preferably moves in the x and y-directions according to a predetermined pattern while the liquid crystal dispensing device 120 discharges liquid crystal at a predetermined rate. Therefore, liquid crystal 107 drops are arranged in a predetermined pattern such that the drops are separated by predetermined spaces. Alternatively, the substrate 105 could be fixed while the liquid crystal dispensing device 120 is moved. However, a liquid crystal drop may be trembled by the movement of the liquid crystal dispensing device 120. Such trembling could induce errors. Therefore, it is preferable that the liquid crystal dispensing device 120 is fixed and the substrate 105 is moved.

Figure 7A:
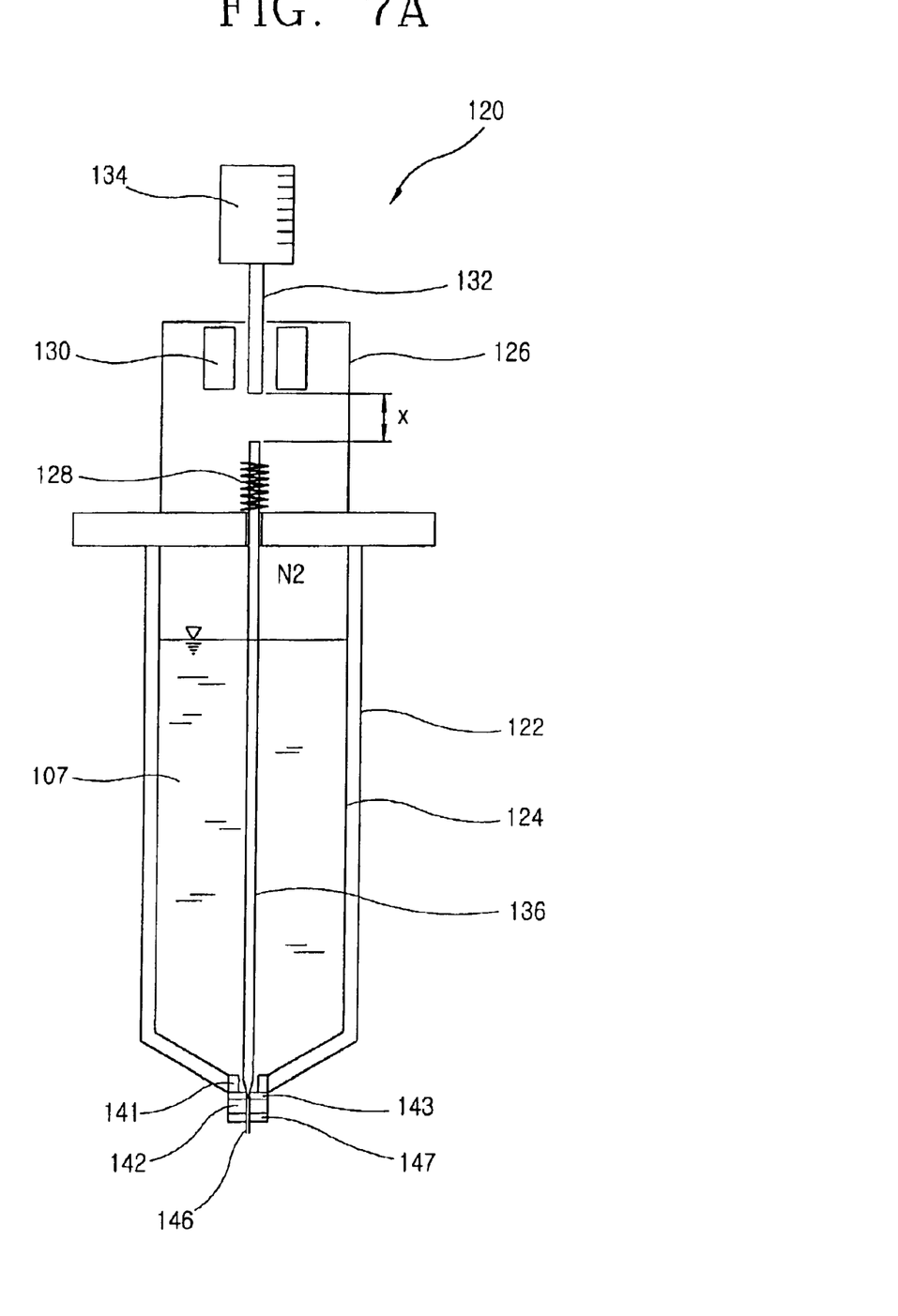
FIG. 7A illustrates a state in which liquid crystal is not dropped from a liquid crystal dropping apparatus.
Figure 7B:
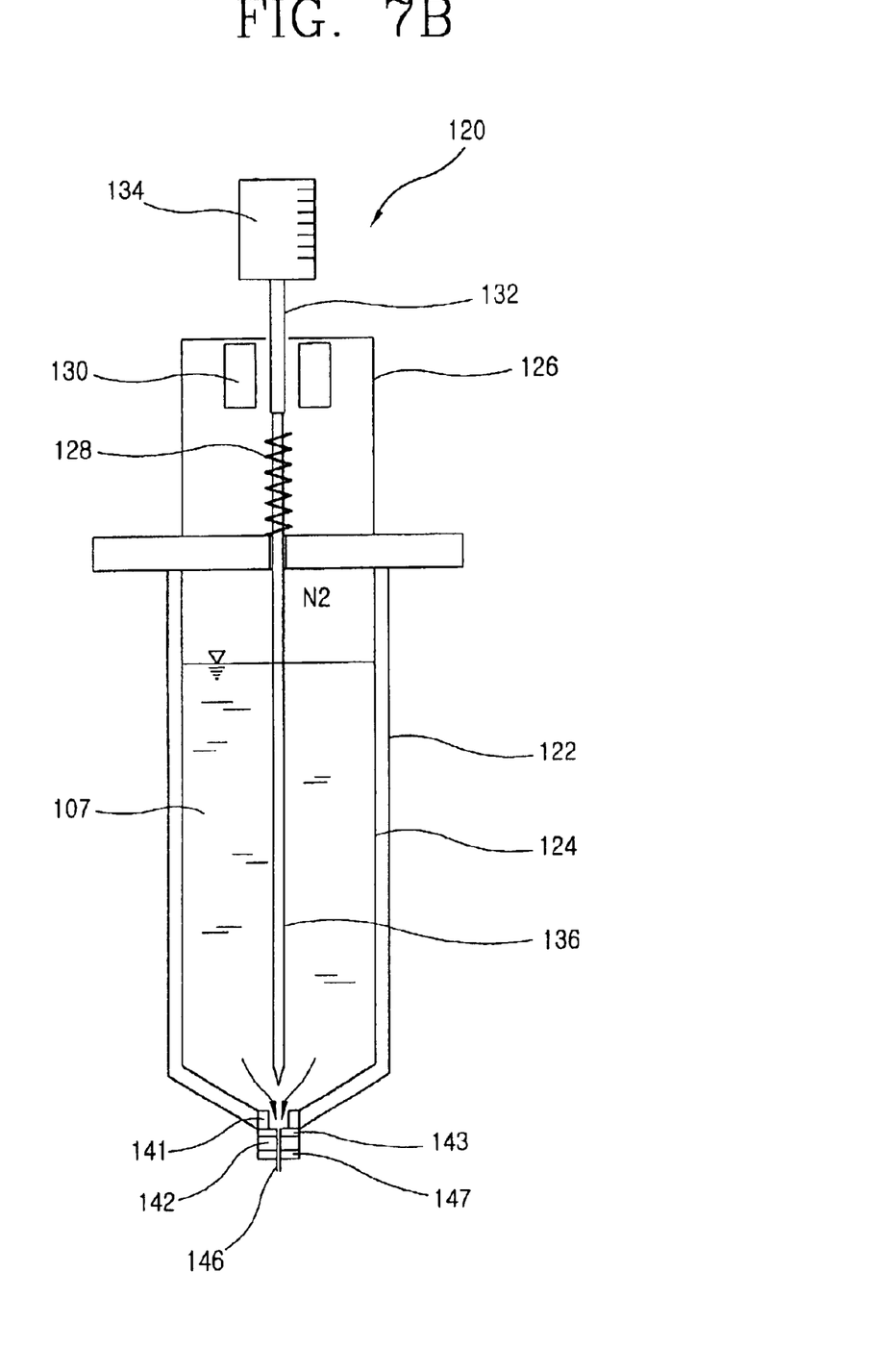
FIG. 7B illustrates a state in which liquid crystal is being dropped from a liquid crystal dropping apparatus.

FIG. 7(a) illustrates the liquid crystal dispensing device 120 in a state in which liquid crystal is not being dropped. FIG. 7(b) illustrates the liquid crystal dispensing device 120 in a state in which liquid crystal is being dropped. As shown in those figures, the liquid crystal dispensing device 120 includes a cylindrically shaped, polyethylene liquid crystal container 124 that is received in a stainless steel case 122. Generally, polyethylene has superior plasticity, it can be easily formed into a desired shape, and does not react with liquid crystal 107. However, polyethylene is structurally weak and is thus easily distorted. Indeed, if the case was of polyethylene it could be distorted enough that liquid crystal might not be dropped at the exact position. Therefore, a polyethylene liquid crystal container 124 is placed in a stainless steel case 122.

A gas supplying tube (not shown) that is connected to an external gas supplying (also not shown) is beneficially connected to an upper part of the liquid crystal chamber 124. A gas, such as nitrogen, is input through the gas supplying tube so as to fill the space without liquid crystal. The gas compresses the liquid crystal, thus tending to force liquid crystal from the liquid crystal dispensing device 120.

The liquid crystal container 124 may be made of a metal such as stainless steel. Then, the liquid crystal container 124 is unlikely to be distorted and an outer case would not be needed. But, a fluorine resin film should be applied on the liquid crystal container 124 to prevent liquid crystal 107 from chemically reacting with the liquid crystal container.

Referring back to FIGS. 7A and 7B, an opening is formed on a lower end of the case 122 by a first connecting portion 141. The first connecting portion 141 mates to a second connecting portion 142. A needle sheet 143 is positioned between the first connecting portion 141 and the second connecting portion 142. Beneficially, the first connecting portion 141 and the second connecting portion 142 are threaded members dimensioned to receive the needle sheet 143, which is then retained in place when the first and second connecting portions are mated. The needle sheet 143 includes a discharge hole through which liquid crystal 107 is discharged into the second connecting portions 142.

Still referring to FIGS. 7A and 7B, a nozzle 146 having a small discharge opening is connected to the second connecting portion 142. The nozzle 146 is for dropping liquid crystal 107 as small, well-defined drops. The nozzle 146 beneficially includes a supporting portion 147 that mates to the second connecting portion 142, thus retaining the nozzle 146 in position. A discharging tube from the discharge hole of the needle sheet 143 to the discharge opening of the nozzle 146 is thus formed.

Still referring to FIGS. 7A and 7B, a needle 136 is inserted into the liquid crystal container 124. One end of the needle 136 contacts the needle sheet 143 discharge hole when the needle 136 is inserted as far as possible into the liquid crystal container 124. That end of the needle 136 is conically shaped and fits into the discharge hole so as to close that hole.

A spring 128 is installed on the other end of the needle 136. That end of the needle extends into an upper case 126 of the liquid crystal dispensing device 120. A bar magnet 132 connected to a gap controlling unit 134 is positioned above the end of the needle 136. The bar magnet 132 is made from a ferromagnetic material or from a soft magnetic material. A cylindrical solenoid 130 is positioned around the bar magnet 132. The solenoid 130 selectively receives electric power. That power produces a magnetic force that interacts with the bar magnet 132 to move the needle 136 against the spring 128, thus opening the discharge hole of the needle sheet 143. When the electric power is stopped, the needle 136 is returned to its static position by the elasticity of the spring 128, thus closing the discharge hole.

Several comments about the liquid crystal dispensing device 120 might be helpful. First, the gap controlling unit 134 controls the distance X between the end of the bar magnet 132 and the end of the needle 136. Next, since one end of the needle 136 repeatedly contacts the needle sheet 143, the needle 136 and the needle sheet 143 are exposed to repeated shock that could damage those parts. Therefore, it is desirable that the end of the needle 136 that contacts the needle sheet 143, and the needle sheet itself, should be formed from materials that resist shock, for example, a hard metal such as stainless steel. Finally, it should be noted that the liquid crystal 107 drop size depends on the time that the discharge hole is open and on the gas pressure. The opening time is determined by the distance (x) between the needle 136 and the magnetic bar 132, the magnetic force produced by the solenoid 130, and the tension of the spring 128. The magnetic force can be controlled by the number of windings that form the solenoid 130, or by the magnitude of the applied electric power. The distance x can be controlled by the gap controlling unit 134.

As shown in FIG. 6, a liquid crystal dispensing device 120 drops liquid crystal onto a substrate. However, in practice it is beneficial to use a number of liquid crystal dispensing devices 120 to speed up liquid crystal application. While the number of liquid crystal dispensing device 120 can vary according to processing conditions, hereinafter it will be assumed that four liquid crystal dispensing devices 120 are used in an automated application process.

Figure 8:
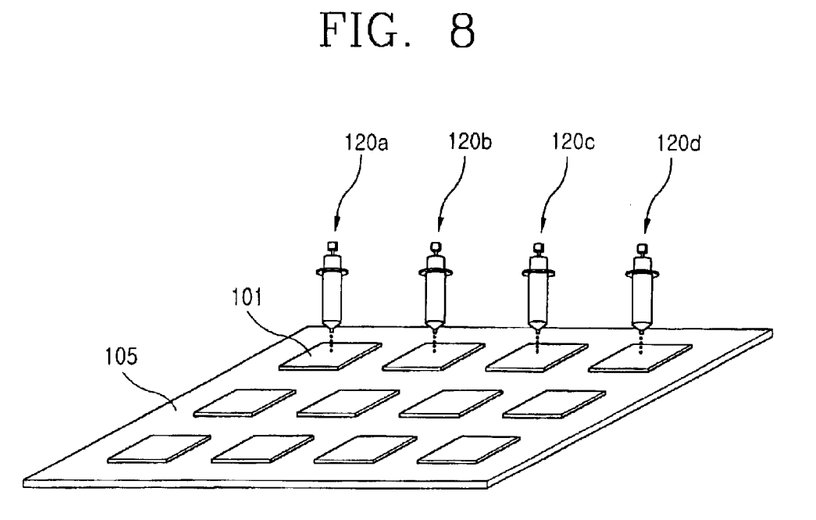
FIG. 8 illustrates dropping liquid crystal onto a substrate having 4 columns of liquid crystal panel areas using four liquid crystal dispensing devices.

FIG. 8 illustrates four liquid crystal dispensing devices 120a~120d applying liquid crystal to a substrate. As shown, that substrate has twelve liquid crystal panel areas 101 that are to receive liquid crystal, with the twelve liquid crystal panel areas 101 being evenly arranged in four columns. With four liquid crystal dispensing devices 120a~120d applying liquid crystal to four columns of liquid crystal panel areas 101, rapid application of liquid crystal is possible.

Figure 9:
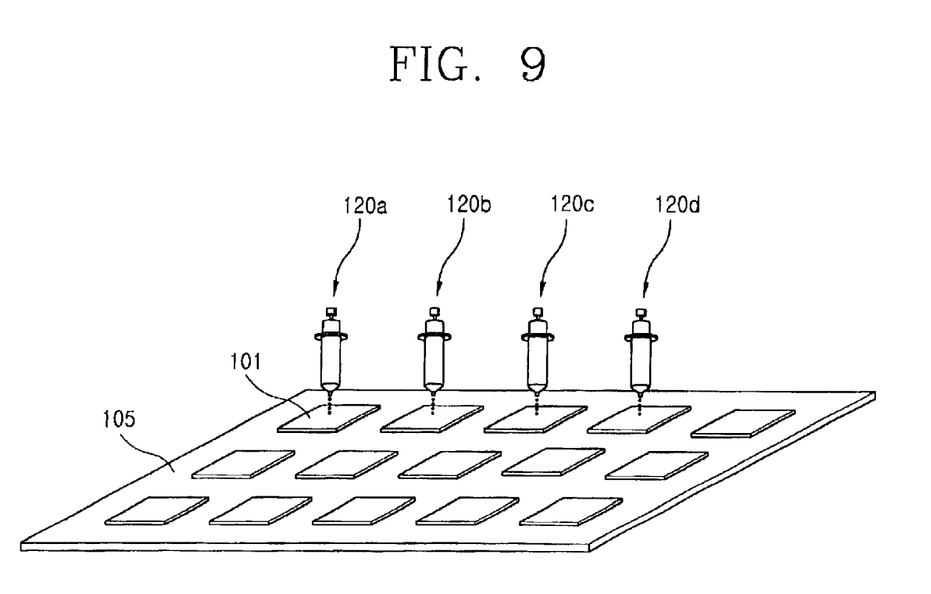
FIG. 9 illustrates dropping liquid crystal onto a substrate having 5 columns of liquid crystal panel areas using four liquid crystal dispensing devices.

However, as shown in FIG. 9, a problem occurs when the liquid crystal is to be applied to a substrate having fifteen liquid crystal panel areas arranged in five columns when using four liquid crystal dispensing devices 120a~120d. Liquid crystal can be applied quickly to four columns, but one of the four liquid crystal dispensing devices 120a~120d must apply liquid crystal to the fifth column. However, in that case one of the four liquid crystal dispensing devices 120a~120d runs out of liquid crystal faster than the other three. That is, the amount of liquid crystal in the liquid crystal dispensing device 120 that drops liquid crystal onto the fifth column is becomes than in the other liquid crystal dispensing devices 120.

Having one liquid crystal container 124 run out of liquid crystal faster than the others is a problem. Consider that each liquid crystal dispensing device 120a~120d has the same fixed capacity, which enables the liquid crystal dispensing devices to be interchangeable. When all liquid crystal in a liquid crystal container 124 has been applied, the liquid crystal container 124 is removed from the liquid crystal dispensing device (120a~120d) and cleaned. Then, the liquid crystal container 124 is re-filled. It is more efficient to clean and refill all four liquid crystal containers 124 at one time. That way, the liquid crystal dispensing devices 120a~120d can operate with the least amount of down time, and adjustments of all of the liquid crystal dispensing device 120a~120d can be done together. However, if one liquid crystal dispensing device 120a~120d runs out faster than the others, efficiency is lost.

According to the present invention, the above problem is addressed by evenly dispensing liquid crystal from all of the liquid crystal dispensing devices over time. When there are M liquid crystal panel columns and N liquid crystal dispensing devices (M>N), liquid crystal is dropped onto N columns of a first substrate using the N liquid crystal dispensing devices, and then liquid crystal is dropped onto the remaining column(s) (M−N) of the first substrate using at least a first of the liquid crystal dispensing devices. Then, liquid crystal is dropped onto N columns of liquid crystal panel areas of a second substrate using the N liquid crystal dispensing devices, and then liquid crystal is dropped onto the remaining column(s) (M−N) of the second substrate using at least a second of the N liquid crystal dispensing devices.

As described above, liquid crystal is dropped onto the liquid crystal panel columns formed on respective substrates using the N liquid crystal dispensing devices. Then, liquid crystal is dropped onto the remaining liquid crystal panel columns (M−N) of different substrates using different liquid crystal dispensing devices. The result is that the liquid crystal is, over time, dispensing from the N liquid crystal dispensing devices equally.

Figure 10A:
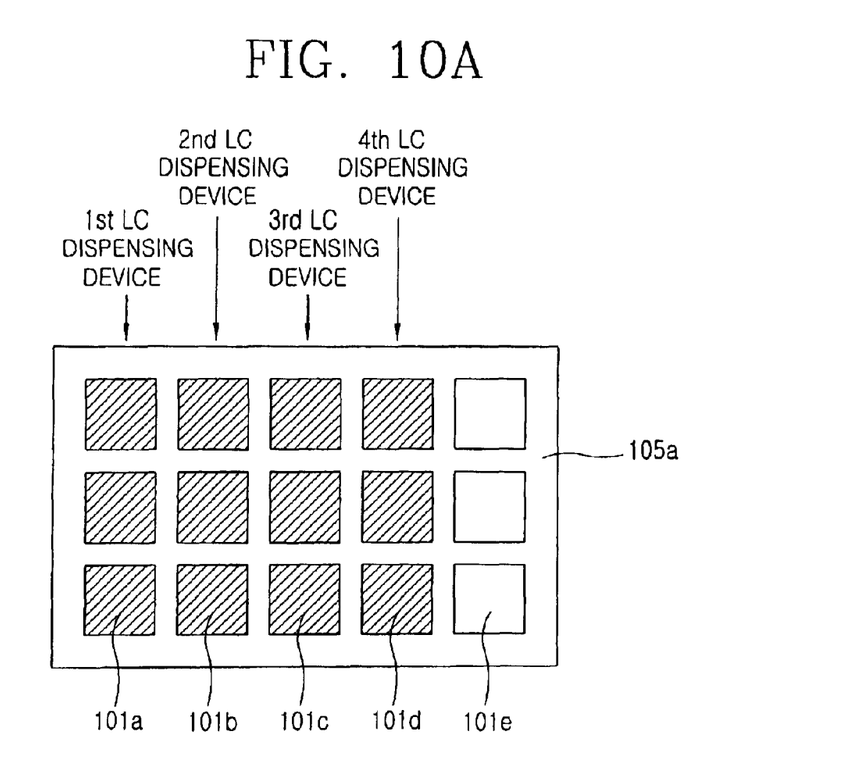
FIGS. 10A and 10B illustrate dropping liquid crystal onto the liquid crystal panel area disposed on a first substrate according to the principles of the present invention.

The present invention will be described with reference to accompanying FIGS. 10A through 12B, which illustrate dropping liquid crystal onto substrates having fifteen liquid panel areas, arranged in five columns, using four liquid crystal dispensing devices. As shown in FIG. 10A, liquid crystal is dropped onto the first to fourth columns of liquid crystal panel areas 101a~101d using the four liquid crystal dispensing devices 120a~120d. The hatched parts of the figures represent the panel areas on which liquid crystal was dropped. As shown in FIG. 10A, liquid crystal is not dropped onto the fifth column (panels 101e).

Figure 10B:
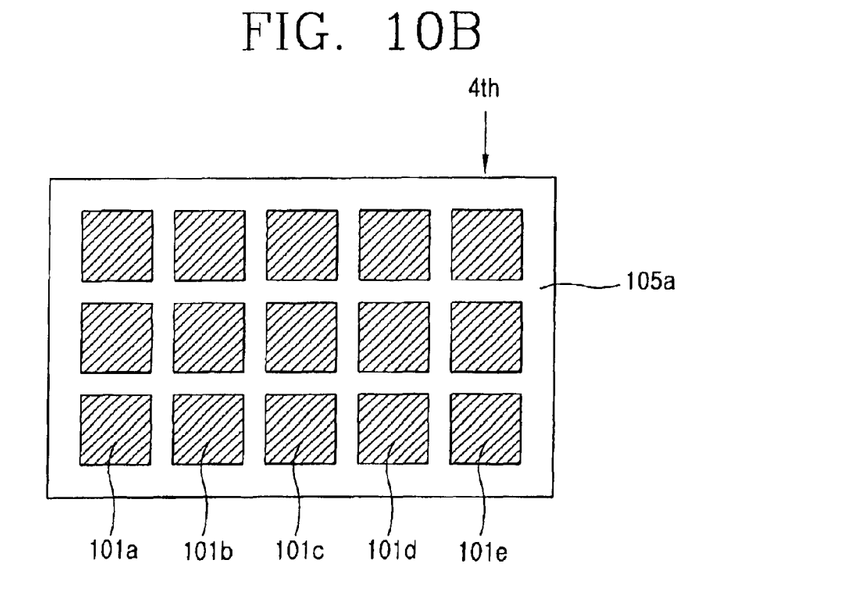

Then, as shown in FIG. 10B, liquid crystal is dropped onto the fifth column (101e) using the fourth liquid crystal dispensing device 120d. This completes the application of liquid crystal to the first substrate 105a. The result is that liquid crystal is dropped from the first~third liquid crystal dispensing devices 120a~120c once, while the fourth device 120d is used twice.

Figure 11A:
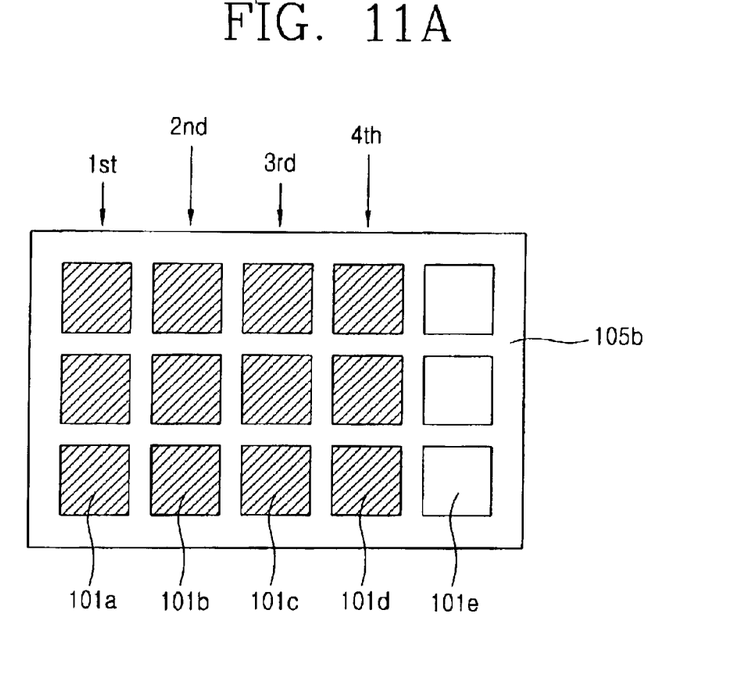
FIGS. 11A and 11B illustrate dropping liquid crystal onto the liquid crystal panel area disposed on a second substrate according to the principles of the present invention.
Figure 11B:
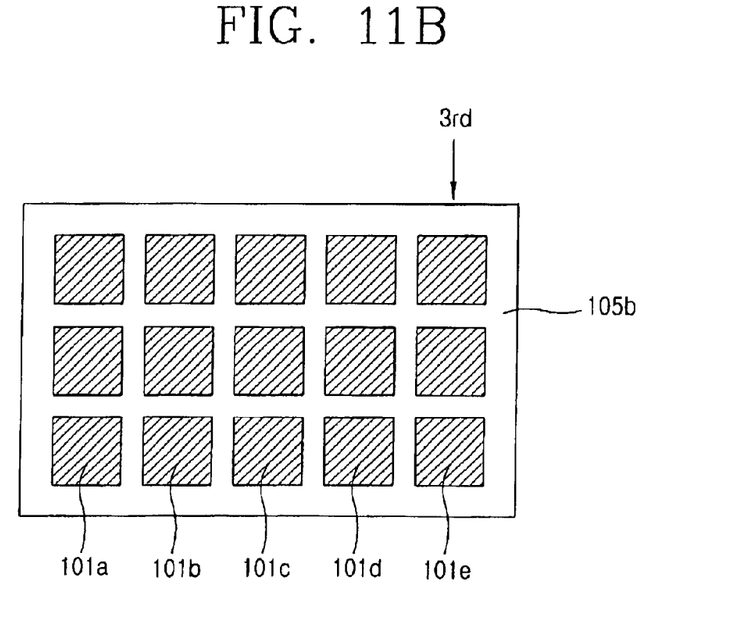

Then, as shown in FIG. 11A, liquid crystal is dropped onto the first~fourth columns 101a~101d of a second substrate 105b by the four liquid crystal dispensing devices 120a~120d. Liquid crystal is not dropped onto the fifth column 101e. Then, as shown in FIG. 11B, liquid crystal is dropped onto the fifth column 101e using the third liquid crystal dispensing device 120c. Thus, the first, second, and fourth liquid crystal dispensing devices 120a, 120b, and 120d are used once, and the third liquid crystal dispensing device 120d is used twice. Therefore, overall, the first and the second liquid crystal dispensing devices 120a and 120b have been used twice, while the third and fourth liquid crystal dispensing devices 120c and 120d have been used three times.

Figure 12A:
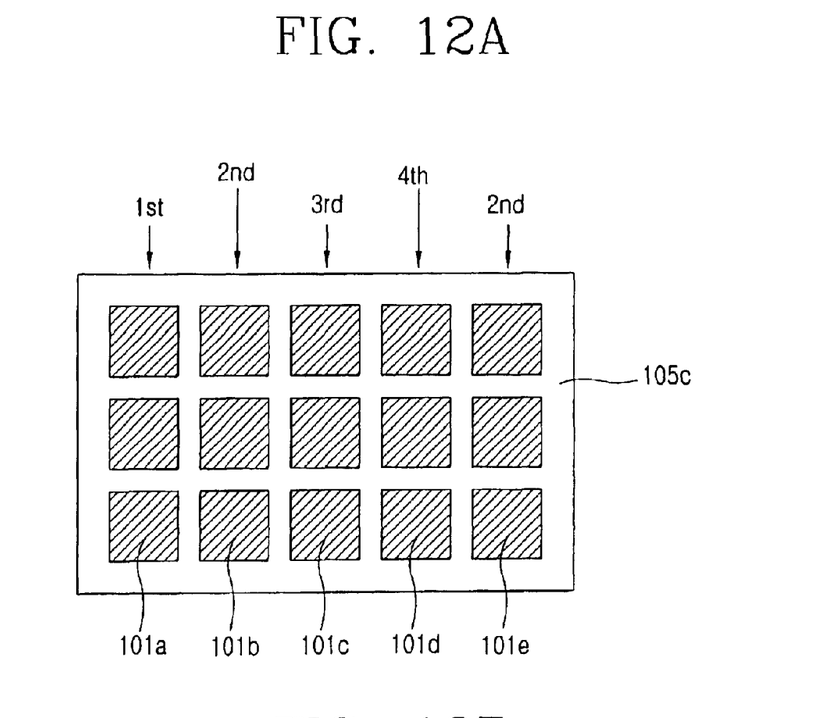
FIGS. 12A and 12B illustrate dropping liquid crystal onto the liquid crystal panel areas disposed on a third and a fourth substrate according to the principles of the present invention.

Then, as shown in FIG. 12A, liquid crystal is simultaneously dropped onto the second~fifth columns 101b~101e of a third substrate 105c using the four liquid crystal dispensing devices 120a~120d. Then, liquid crystal is dropped onto the liquid crystal panel area of the first column 101a using the second liquid crystal dispensing device 120b. Thus, the first, third and fourth liquid crystal dispensing devices 120a, 120c, and 120d are used once, and the second liquid crystal dispensing device 120b is used twice. Therefore, overall, the first liquid crystal dispensing devices 120a has been used three times, while the second, third and fourth liquid crystal dispensing devices 120c and 120d have been used four times.

Figure 12B:
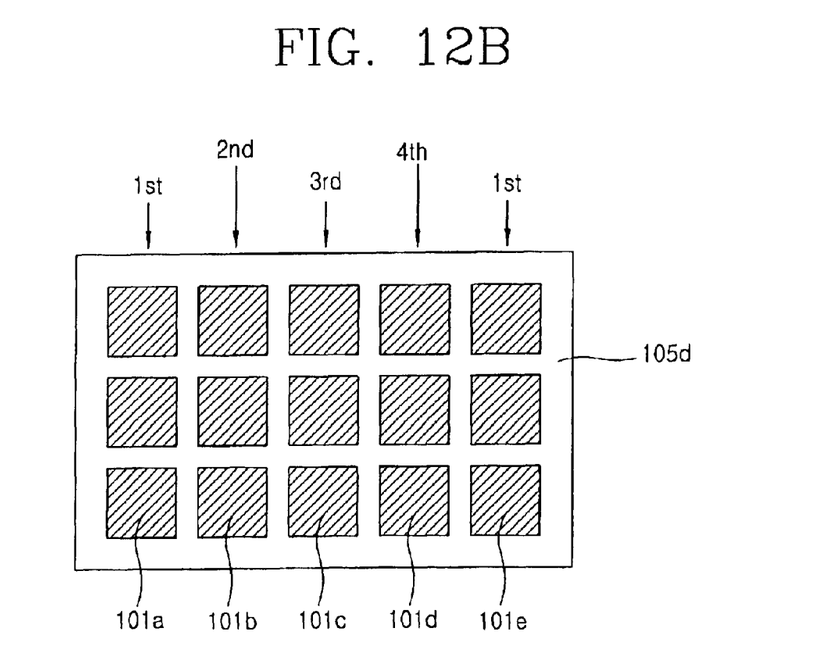

Next, as shown in FIG. 12B, liquid crystal is simultaneously dropped onto the second~fifth columns 101b~101e of a fourth substrate 105d using the four liquid crystal dispensing devices 120a~120d. In addition, liquid crystal is dropped onto the first column 101a using the first liquid crystal dispensing device 120a.

Therefore, overall, the all of the liquid crystal dispensing devices 120a have been used five times. Consequently, the remaining amount of liquid crystal in each liquid crystal container 124 is the same. Therefore, the cleaning and refilling of the liquid crystal containers can be efficiently performed at one time.

The foregoing has described a particular sequence of using four liquid crystal dispensing devices 120a~120d to apply liquid crystal to five columns of liquid crystal panel areas 101a~101e. However, it is not necessary to follow the specific sequence described above. For example, liquid crystal could be dropped on the first~fourth columns of every substrate, and then the fifth column could have liquid crystal applied by each of the four liquid crystal dispensing devices 120a~120d. Furthermore, there might be six columns and four liquid crystal dispensing devices 120a~120d. In that case, liquid crystal could be applied to four columns of a first substrate using the four liquid crystal dispensing devices, and then liquid crystal could be applied to the two remaining columns using the last two of the four liquid crystal dispensing devices. Then, liquid crystal could be applied to four columns of a second substrate using the four liquid crystal dispensing devices, and then liquid crystal could be applied to the two remaining columns using the first two of the four liquid crystal dispensing devices.

As described above, according to the present invention, liquid crystal in N liquid crystal dispensing devices is, over time, evenly dispensed onto substrates having M liquid crystal panel columns, where M>N.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of applying liquid crystal to a substrate having a plurality of liquid crystal panel columns using a plurality of liquid crystal dispensing devices, the method comprising:
   applying liquid crystal to a first plurality of liquid crystal panel columns formed on a first substrate, except on to at least a first liquid crystal panel column, by using the plurality of liquid crystal dispensing devices;
   applying liquid crystal to the first liquid crystal panel column by using at least a first liquid crystal dispensing device of the plurality of liquid crystal dispensing devices;
   applying liquid crystal to a second plurality of liquid crystal panel columns formed on a second substrate, except onto at least a second liquid crystal panel column, by using the plurality of liquid crystal dispensing devices; and
   applying liquid crystal to the second liquid crystal panel column using at least a second liquid crystal dispensing device of the plurality of liquid crystal dispensing devices.

2. The method of claim 1, wherein the first liquid crystal panel column is in the same column position on the first substrate as the column position of the second liquid crystal panel column on the second substrate.

3. The method of claim 1, wherein the number of liquid crystal panel columns is greater than the number of liquid crystal dispensing devices.

4. The method of claim 1, further comprising:
   applying liquid crystal to a third plurality of liquid crystal panel columns formed on a third substrate, except onto at least a third liquid crystal panel column, by using a plurality of liquid crystal dispensing devices; and
   applying liquid crystal to the third liquid crystal panel column using at least a third liquid crystal dispensing device of the plurality of liquid crystal dispensing devices.

5. The method of claim 4, wherein the third liquid crystal panel column is in the same column position on the third substrate as the column position of the first liquid crystal panel column on the first substrate.

6. The method of claim 4, further comprising:
   applying liquid crystal to a fourth plurality of liquid crystal panel columns formed on a fourth substrate, except onto at least a fourth liquid crystal panel column, by using a plurality of liquid crystal dispensing devices; and
   applying liquid crystal to the fourth liquid crystal panel column using at least a fourth liquid crystal dispensing device of the plurality of liquid crystal dispensing devices.

7. The method of claim 6, wherein the fourth liquid crystal panel column is in the same column position on the fourth substrate as the column position of the first liquid crystal panel column on the first substrate.

8. A method of applying liquid crystals from N liquid crystal dispensing devices onto a plurality of substrates, each substrate having a plurality of liquid crystal panels aligned in M columns, wherein M is greater than N, the method comprising:
   applying liquid crystals from the N liquid crystal dispensing devices onto the liquid crystal panels in N columns of a first substrate;
   applying liquid crystals onto the liquid crystal panels of an N+1th column of the first substrate using a first liquid crystal dispensing device of the N liquid crystal dispensing devices;

applying liquid crystals from the N liquid crystal dispensing devices onto the liquid crystal panels in N columns of a second substrate; and applying liquid crystals onto the liquid crystal panels of an N+1th column of the second substrate using a second liquid crystal dispensing device of the N liquid crystal dispensing devices.

9. The method of claim 8, wherein the N+1th column of the first liquid crystal substrate is in the same column position as the N+1th column of the second liquid crystal substrate.

10. The method of claim 8, further comprising:

applying liquid crystals from the N liquid crystal dispensing devices onto the liquid crystal panels in N columns of a third substrate;

applying liquid crystals onto the liquid crystal panels of an N+1th column of the third substrate using a third liquid crystal dispensing device of the N liquid crystal dispensing devices.

11. The method of claim 10, wherein the third liquid crystal panel column is in the same column position as the first liquid crystal panel column.

12. The method of claim 8, further comprising:

applying liquid crystals from the N liquid crystal dispensing devices onto the liquid crystal panels in N columns of a fourth substrate;

applying liquid crystals onto the liquid crystal panels of an N+1th column of the fourth substrate using a fourth liquid crystal dispensing device of the N liquid crystal dispensing devices.

13. The method of claim 12, wherein the fourth liquid crystal panel column is in the same column position as the first liquid crystal panel column.

* * * * *